United States Patent
Bisschops et al.

(10) Patent No.: US 6,304,630 B1
(45) Date of Patent: Oct. 16, 2001

(54) METHOD OF GENERATING EUV RADIATION, METHOD OF MANUFACTURING A DEVICE BY MEANS OF SAID RADIATION, EUV RADIATION SOURCE UNIT, AND LITHOGRAPHIC PROJECTION APPARATUS PROVIDED WITH SUCH A RADIATION SOURCE UNIT

(75) Inventors: Theodorus Hubertus Josephus Bisschops, Eindhoven; Joseph Johannes Antonius Maria Vrakking, Valkenswaard; Mark Theo Meuwese, Eindhoven, all of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/713,878

(22) Filed: Nov. 16, 2000

(30) Foreign Application Priority Data

Dec. 24, 1999 (EP) .................................. 99204535

(51) Int. Cl.⁷ ....................................... H05H 1/28
(52) U.S. Cl. .............................. 378/119; 378/123; 378/34
(58) Field of Search .................... 378/123, 119, 378/34, 121, 143, 120

(56) References Cited

U.S. PATENT DOCUMENTS

| 5,068,844 | * 11/1991 | Choe et al. ........................... 378/119 |
| 5,153,898 | 10/1992 | Suzuki et al. .......................... 378/34 |
| 5,991,360 | * 11/1999 | Matsui et al. ......................... 378/119 |
| 6,045,877 | * 4/2000 | Gleason et al. ....................... 427/522 |
| 6,133,577 | * 10/2000 | Gutowski et al. ................. 250/493.1 |
| 6,180,952 | * 1/2001 | Haas et al. ......................... 250/492.2 |

FOREIGN PATENT DOCUMENTS

| 0779528A2 | 6/1997 | (EP) . |
| 9733204A1 | 9/1997 | (WO) . |

* cited by examiner

Primary Examiner—Robert H. Kim
Assistant Examiner—Hoon Koo Song
(74) Attorney, Agent, or Firm—Steven R. Biren

(57) ABSTRACT

A method is described for generating EUV radiation, comprising the steps of:
  generating a flow (35) of liquid droplets (39);
  injecting the flow into a source space (33) connected to a vacuum pump (34), and
  successively irradiating individual droplets (39) with an intense, pulsed, laser beam (41) focused on a droplet, thus creating a plasma (47) which emits EUV radiation. In order to prevent that liquid vapor destroys the vacuum in the source space (33) and to guarantee a continuous flux of EUV radiation, the flow (35) is guided through additional vacuum spaces (53, 56, 63) in series with the source space. Also described are an EUV radiation source unit for realizing the method and the application of the method in the manufacture of devices, like IC devices, and in a lithographic projection apparatus.

18 Claims, 4 Drawing Sheets

METHOD OF GENERATING EUV RADIATION, METHOD OF MANUFACTURING A DEVICE BY MEANS OF SAID RADIATION, EUV RADIATION SOURCE UNIT, AND LITHOGRAPHIC PROJECTION APPARATUS PROVIDED WITH SUCH A RADIATION SOURCE UNIT

Method of generating EUV radiation, method of manufacturing a device by means of said radiation, EUV radiation source unit, and lithographic projection apparatus provided with such a radiation source unit.

BACKGROUND OF THE INVENTION

The invention relates to a method of generating EUV radiation, in which a mobile medium is injected into a vacuum source space and each time a part of said medium in the source space is irradiated with a pulsed and focused energy-rich laser beam, and in which said medium part is converted into a plasma-emitting EUV radiation, whereafter the medium is passed through a first further vacuum space in series with the source space, said vacuum space being maintained at a lower vacuum degree than the source space.

The invention also relates to a method of manufacturing a device with the aid of this radiation. The invention further relates to an EUV radiation source unit and to a lithographic projection apparatus provided with such a radiation source unit.

A mobile medium is understood to mean a medium which does not have a solid shape but whose shape is determined by the holder accommodating the medium or the guide through which the medium is transported. A vacuum space is understood to mean a space in which a vacuum degree at a pressure of the order of $10^{-1}$ mbar or lower prevails.

A lithographic apparatus is used, inter alia, in the manufacture of integrated electronic circuits or ICs for imaging an IC mask pattern, present in a mask, each time on a different IC area of a substrate. This substrate, which is coated with a radiation-sensitive layer, provides space for a large number of IC areas. The lithographic apparatus may also be used in the manufacture of, for example, liquid crystalline image display panels, integrated, or plenary optical systems, charge-coupled detectors (CCDs) or magnetic heads.

Since it is desired to accommodate an ever increasing number of electronic components in an IC, increasingly smaller details, or line widths, of IC patterns must be imaged. Consequently, increasingly stricter requirements are imposed on the imaging quality and the resolving power of the projection system in the apparatus, which projection system is generally a lens system in the current lithographic apparatuses. The resolving power, which is a measure of the smallest detail which can still be imaged satisfactorily, is proportional to $\lambda/NA$, in which $\lambda$ is the wavelength of the imaging, or projection, beam and NA is the numerical aperture of the projection system. To increase the resolving power, the numerical aperture may, in principle, be enlarged and/or the wavelength may be reduced. An increase of the numerical aperture, which is currently already fairly large, is no longer very well possible in practice because the depth of focus of the projection system, which is proportional to $\lambda/NA^2$, becomes too small and the correction for the required image field becomes too difficult.

The requirements to be imposed on the projection system may be mitigated or, when maintaining these requirements, the resolving power may be increased if, instead of a stepping lithographic apparatus, a step-and-scan lithographic apparatus is used. In a stepping apparatus, a full-field illumination is used, i.e. the entire mask pattern is illuminated in one run and imaged as one whole on an IC area of the substrate. After a first IC area is illuminated, a step is made to a subsequent IC area, i.e. the substrate holder is moved in such a way that the next IC area is positioned under the mask pattern, whereafter this area is illuminated, and so forth until all IC areas of the substrate are provided with the mask pattern. In a step-and-scan apparatus, each time only a rectangular or annular segment-shaped area of the mask pattern, and hence a corresponding sub-area of a substrate IC area is illuminated, and the mask pattern and the substrate are synchronously moved through the illumination beam, taking the magnification of the projection system into account. Each time, a subsequent area of the mask pattern is imaged on a corresponding sub-area of the relevant IC area of the substrate. After the entire mask pattern has been imaged in this way on an IC area, the substrate holder performs a step, i.e. the start of a subsequent IC area is introduced into the projection beam and the mask is set to, for example, the starting position, whereafter said next IC area is scan-illuminated via the mask pattern.

If even smaller details are to be satisfactorily imaged with a step-and-scan lithographic apparatus, the only possibility is to reduce the wavelength of the projection beam. In the current step-and-scan apparatuses, already deep UV (DUV) radiation is used, i.e. radiation having a wavelength of the order of several hundred nanometers, for example, 248 nm or 193 nm from, for example, an excimer laser. Another possibility is the use of extreme UV (EUV) radiation, also referred to as soft X-ray radiation, having a wavelength in the range of several nm to several tens of nm. Extremely small details, of the order of 0.1 $\mu$m or smaller, can be satisfactorily imaged with such a radiation.

Since no suitable lens material is available for EUV radiation, a mirror projection system instead of a hitherto conventional lens projection system must be used for imaging the mask pattern on the substrate. For forming a suitable illumination beam of the radiation from the EUV radiation source, mirrors are also used in the illumination system. The article "Front-end design issues in soft X-ray lithography" in Applied Optics, Vol. 23, No. 34, Jan, 12, 1993, pp. 7050–56 describes a lithographic apparatus in which EUV radiation is used and whose illumination system comprises three mirrors and the imaging, or projection, system comprises four mirrors.

As described in the article "Debris-free soft X-ray generation using a liquid droplet laser-plasma target" in Applications of Laser Plasma Radiation II, SPIE 2523, 1995, pp. 88–93, EUV radiation can be generated by focusing a laser beam on water droplets. The required stable flux of individual micro water droplets can be obtained by means of a capillary tube which is caused to vibrate by a piezoelectric driver. Each water droplet impinged upon by the laser beam is consecutively converted by the high temperature into a plasma which emits EUV radiation.

In EUV lithographic apparatuses, it is a great problem to illuminate the substrate at a sufficiently high intensity. A first cause of this problem, which applies to all EUV apparatuses, is that the mirrors used are considerably less than 100% reflecting. Each of these mirrors has a multilayer structure whose composition is adapted as satisfactorily as possible to the wavelength of the projection beam used. Examples of such multilayer structures are described in U.S. Pat. No. 5,153,898. A multilayer structure which is often mentioned in literature is the structure consisting of silicon layers alternating with molybdenum layers. For radiation from a plasma source, mirrors provided with such a multilayer structure theoretically have a reflection of the order of 73% to 75%, but in practice the reflection is currently not larger than 65%. When using said number of seven mirrors, each with a reflection of 68%, only 6.7% of the radiation emitted by the source reaches the substrate. For a lithographic apparatus, this means in practice that the illumination time should be relatively long so as to obtain the desired quantity of radiation energy on a substrate, and for a scanning apparatus, particularly the scanning rate should be relatively small. However, it is essential for these apparatuses that the scanning rate is as high as possible and the illumination time is as short as possible so that the throughput, i.e. the number of substrates which may be used per unit of time, is as high as possible. This can only be achieved with an EUV radiation source supplying a sufficient intensity. A second cause of the problem is related to the fact that the radiation path for the EUV radiation must extend in a vacuum, i.e. in a space with a pressure of the order of $10^{-2}$ mbar and preferably lower, because otherwise too much EUV radiation is absorbed. In a water plasma source, there is the problem that the water droplets moving through the source space give off water vapor whose vapor pressure at room temperature is approximately 23 mbar. Without any further measures, it is therefore impossible to comply with a vacuum requirement of $10^{-2}$ mbar and preferably considerably lower, for example, $10^{-6}$. Moreover, the water vapor may get through apertures in the wall of the source space, which apertures are intended for causing the laser beam to enter and exit from the source space and for causing the generated EUV radiation to exit from the source space so that the water vapor may deposit on the mirrors of the illumination system and the projection system and attack these mirrors, thus reducing their reflection. Similar problems occur when using other liquids or gases such as clustered xenon with which an EUV-emitting plasma can be formed.

The article "Laser produced oxygen plasmas" in Proceedings of the Second International Symposium on Heat and Mass Transfer under Plasma conditions, 1999 proposes to solve the problem of the water droplets and the water vapor by providing an extra vacuum space behind the source space in the direction of movement of the medium and to interconnect the two spaces via a narrow opening. The extra vacuum space is connected to its own vacuum pump which maintains a pressure in this space which is higher than the pressure in the source space. The object of this so-called differential pumping is that the water droplets injected into the source space and expanding and partially changing over to water vapor enter the space where they are converted into water vapor. Also the water vapor formed in the source space must enter the extra vacuum space so that all the water injected into the system is removed as water vapor by the pump of the further vacuum space. However, it has been found that this solution still presents problems.

SUMMARY OF THE INVENTION

It is an object of the present invention to provide a method in which the abovementioned problems are prevented. To this end, this method is characterized in that the medium is passed through at least a second further vacuum space in series with the source space, which second vacuum space is maintained at a lower vacuum degree than the source space.

The vacuum degree is understood to mean the extent to which an absolute vacuum is approached. The vacuum degree is inversely proportional to the vapor pressure so that a high vacuum degree means that the (residual) pressure is very low.

By providing a second further vacuum space behind the first further vacuum space and by exhausting the second further vacuum space with a separate pump in such a way that the vacuum degree of this space is lower than that of the first further vacuum space, an improvement of the method can be obtained.

An essential improvement is, however, obtained if the method is characterized in that the mobile medium is injected via the second further vacuum space.

This method is based on the recognition that when using only one vacuum space placed behind the source space, the part of the total water vapor formed in the source unit and ultimately reaching this vacuum space and being removed from this space is considerably smaller than expected, and that this new problem can most simply be solved by taking a measure for the flow of water droplets before they arrive at the position where the plasma formation must take place. When passing through the second vacuum space, already a part, for example 25%, of the water is evaporated and the water vapor formed is already pumped off in this space so that this part does not reach the source space. In principle, the envisaged object can be achieved with the aid of the first vacuum space. By making use of the described combination, it is possible to pump off all water or another liquid injected into the system as vapor so that the radiation source unit can function continuously. Due to the low pressure in the source space itself, the risk of escape of vapor to other spaces of the apparatus, in which the radiation source unit is used, and which may damage optical elements of this apparatus, is reduced considerably.

The method may be further characterized in that, after passing through the source space and the first further vacuum space, the medium is passed through a third further vacuum space in which a vacuum degree is maintained which is lower than that of the first further vacuum space.

Water, which is possibly left and is troublesome, can be removed with the aid of this third vacuum space.

A first embodiment of the method is characterized in that an intermittent flow of liquid droplets is used as a mobile medium, which forms an EUV-emitting plasma upon irradiation with a laser beam.

Various liquids may be used as a mobile medium in the radiation source unit, with the choice of a given liquid being dependent, inter alia, on the desired wavelength of the EUV radiation.

The first embodiment of the method is preferably further characterized in that water droplets are used as liquid droplets.

Water is a relatively clean medium and already good results have been achieved with a radiation source in which a flow of water droplets is used.

A second embodiment of the method is characterized in that a clustered gas is injected as a mobile medium into the source space, in which the clusters form an EUV-emitting plasma upon irradiation with a laser beam.

This embodiment is preferably further characterized in that the gas is xenon.

The invention also relates to a method of manufacturing a device, in which the dimensions of the smallest details are smaller than 0.25 $\mu$m, on a substrate, in which different layers of the device are formed in successive steps by imaging, by means of EUV radiation, for each layer first a specific mask pattern on the substrate coated with a radiation-sensitive layer and by subsequently removing material from, or adding material to, areas marked by the mask image. This method is characterized in that the EUV radiation is generated by means of the method described hereinbefore.

The invention further relates to an EUV radiation source unit comprising:
- a vacuum source space;
- an inlet tube located on a first side of the source space for injecting a mobile medium into the source space;
- a pulsed high-power laser;
- an optical system for focusing the laser beam supplied by the laser on a fixed position within the source space where the mobile medium passes,
- a first further vacuum space which, viewed in the direction of movement of the medium, is located behind the source space with which it communicates, which vacuum space is connected to its own vacuum pump.

This EUV radiation source unit is characterized by at least a second further vacuum space in series with the source space, which second vacuum space is connected to its own vacuum pump maintaining this space at a vacuum degree which is lower than that of the source space.

The source space may be maintained at a total high vacuum degree, for example, the total pressure therein is $10^{-4}$ mbar or less. However, this space may also be maintained at a partial high vacuum degree if a rare gas such as helium or argon is present in this space. Then, for example, the helium pressure is $10^{-1}$ mbar and the water pressure is $10^{-4}$ mbar or less.

This radiation source unit has by far the best effect if it is further characterized in that, viewed in the direction of movement of the medium, the second further vacuum space is arranged in front of the source space.

The radiation source unit may be further characterized in that, viewed in the direction of movement of the medium, a third vacuum space is present behind the first further vacuum space, which third vacuum space communicates with the first further vacuum space and is connected to its own vacuum pump maintaining the third vacuum space at a vacuum degree which is lower than that of the first further vacuum space.

The radiation source unit is preferably further characterized in that, viewed in the direction of movement of the medium, a heating element is arranged in the last vacuum space.

This heating element prevents the formation of ice in the radiation source unit.

A first embodiment of the radiation source unit is characterized in that the inlet tube is connected to a liquid supply.

This embodiment is preferably further characterized in that the liquid supply is a water supply.

A second embodiment of the radiation source unit is characterized in that the inlet tube is connected to a gas supply.

This embodiment is further preferably characterized in that the gas supply is a xenon supply.

Finally, the invention relates to a lithographic projection apparatus for imaging a mask pattern on a substrate provided with a radiation-sensitive layer, which apparatus comprises an illumination system for illuminating the mask pattern and a projection system for imaging the illuminated mask pattern on the substrate, the illumination system comprising an EUV radiation source and the optical components of the illumination system and those of the projection system being present in a vacuum space. This apparatus is characterized in that the EUV radiation source is an EUV radiation source unit as described hereinbefore.

These and other aspects of the invention are apparent from and will be elucidated with reference to the embodiments described hereinafter.

DESCRIPTION OF THE PREFERRED EMBODIMENTS

Figure 1:
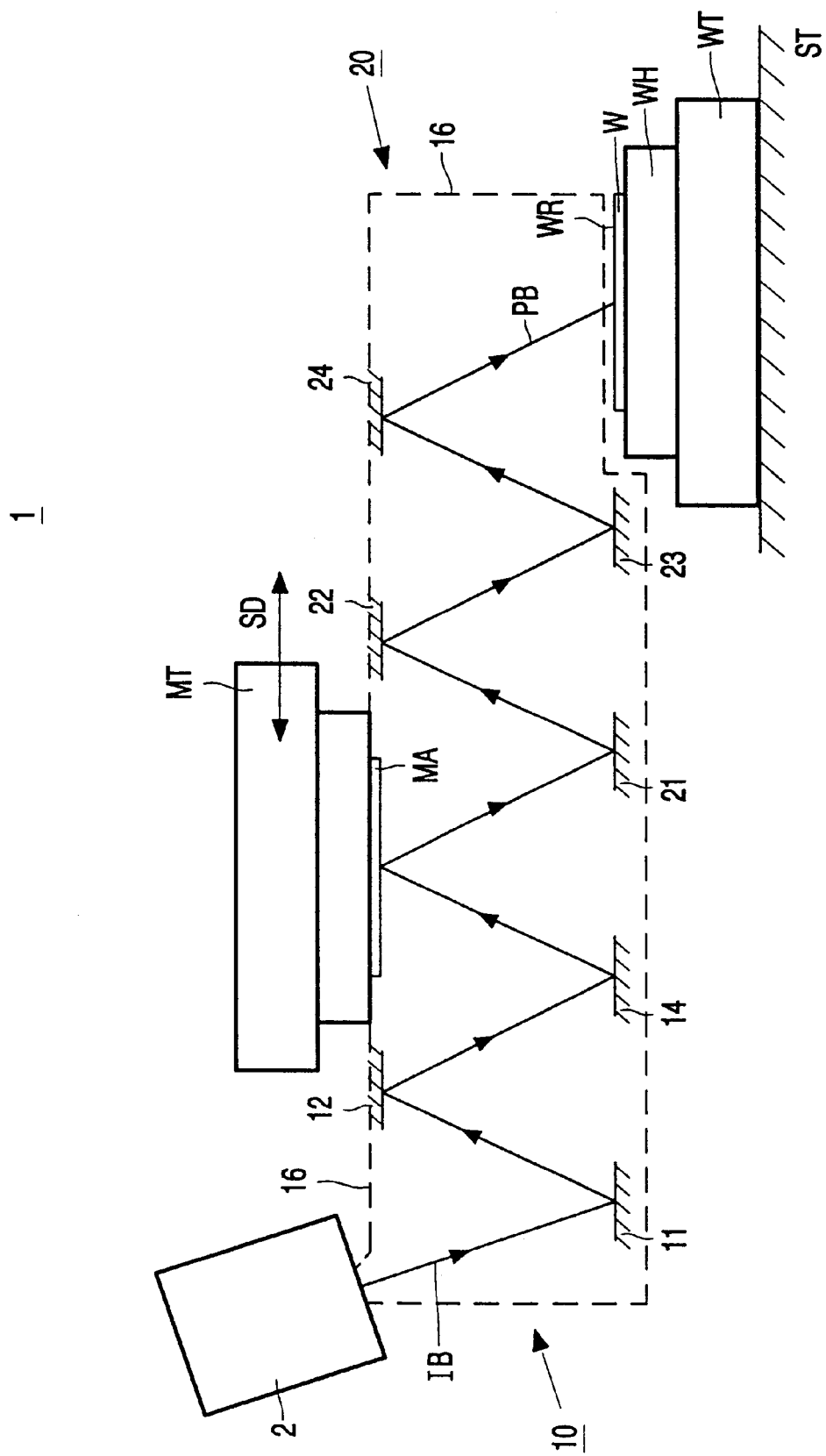
FIG. 1 shows a first embodiment of a step-and-scan lithographic projection apparatus in which the radiation source unit according to the invention may be used.

FIG. 1 shows diagrammatically an embodiment of a step-and-scan lithographic projection apparatus 1 in which an EUV radiation source according to the invention may be used and with which the method according to the invention may be performed. The apparatus comprises an illumination system for illuminating a mask MA and a mirror projection system for imaging a mask pattern, present in the mask, on a substrate W, for example, a semiconductor substrate which is provided with an EUV radiation-sensitive photoresist WR. The illumination system 10 shown in the left-hand part of FIG. 1 is designed in known manner in such a way that the illumination beam IB supplied by the system at the area of the mask MA has a cross-section in the form of an annular segment or a rectangle, and has a uniform intensity. The illumination system comprises, for example, three mirrors 11, 12 and 13 which are maximally reflecting for EUV radiation at, for example, a wavelength of the order of 13 nm because they have a multilayer structure of, for example, silicon layers alternating with molybdenum layers. The mask MA is arranged in a mask holder MH which forms part of a mask table MT. By means of this table, the mask can be moved in the scanning direction SD and possibly in a second direction perpendicular to the plane of the drawing, such that all areas of the mask pattern can be introduced under the illumination spot formed by the illumination beam IB. The mask table and the mask holder are shown only diagrammatically and may be constructed in different ways. The substrate W to be illuminated is arranged in a substrate holder WH which is supported by a substrate table WT, also referred to as stage. This table can move the substrate in the scanning direction SD but also in a direction perpendicular to the plane of the drawing. The substrate table is supported, for example, by a table bearing ST. For further details of a step-and-scan apparatus, reference is made by way of example to PCT patent application WO 97/33204 (PHQ 96004).

For imaging the mask pattern on the substrate with a reduction of, for example, 4x, a mirror projection system 20 comprising, for example, four mirrors 21, 22, 23 and 24 is arranged between the mask and the substrate. For the sake of simplicity, the mirrors are shown as plane mirrors but actually these mirrors, as well as those of the illumination system 10, are concave and convex mirrors and the mirror projection system 20 is designed in such a way that the desired sharp image is realized at a reduction of, for example 4x. The design of the mirror projection system does not form part of the present patent application. Analogously as the mirrors of the illumination system, each mirror 21, 22, 23 and 24 is provided with a multilayer structure of first layers having a first refractive index, alternating with second layers having a second refractive index.

Instead of four mirrors, the mirror projection system may alternatively comprise a different number of mirrors, for example, three, five or six. Generally, the accuracy of the image will be greater as the number of mirrors is larger, but there will be more radiation loss. Thus, a compromise will have to be found between the quality of the image and the radiation intensity on the substrate, which intensity also determines the velocity at which the substrates are illuminated and can be passed through the apparatus. Mirror projection systems having four, five or six mirrors for lithographic apparatuses are known per se. For example, a six-mirror system is described in EP-A 0 779 528.

Since EUV radiation is absorbed by gases and vapor, such as water vapor, the space in which this radiation propagates must be a highly vacuum-exhausted space. Minimally, both the illumination system, from the radiation source to the mask, and the projection system, from the mask to the substrate, must be arranged in a vacuum-tight space, which is denoted by means of the envelope 16 in FIG. 1. Instead of being accommodated in the same envelope, the illumination system and the projection system may be alternatively accommodated in separate envelopes.

Figure 2:
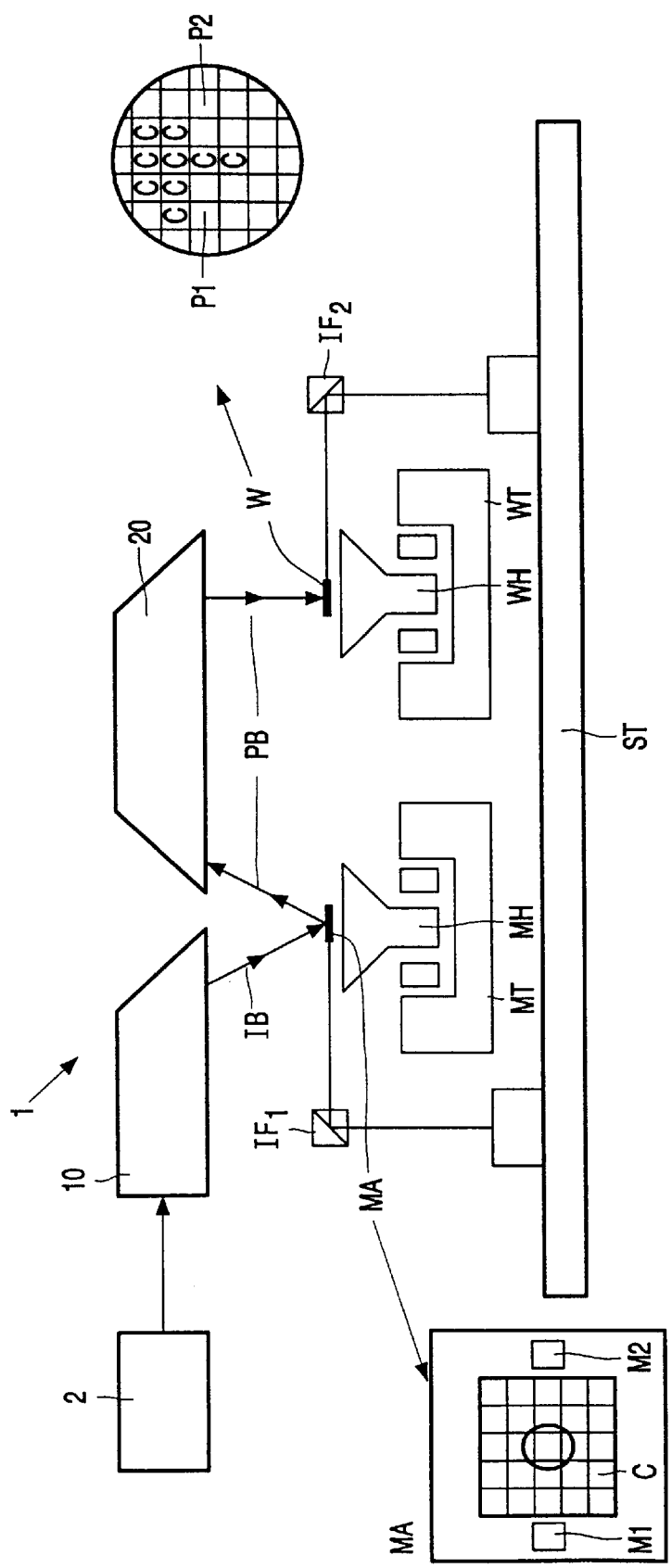
FIG. 2 shows a second embodiment of such an apparatus.

The mask MA and the substrate W may be juxtaposed, as shown in FIG. 2, instead of opposite each other. In this Figure, the components corresponding to those in FIG. 1 have the same reference numerals or symbols. The separate mirrors of the illumination system are not shown in FIG. 2 but form part of the block 10 representing the illumination system, with which the illumination beam is given the desired shape and the uniform intensity. FIG. 2 is a plan view of a mask with a mask pattern C and a plan view of a substrate W with substrate fields, with an image of the mask pattern C being formed on each field. The mask and the substrate comprise two or more alignment marks M1 and M2, and P1 and P2, respectively, each, which are used for aligning the mask pattern with respect to the substrate or with respect to each substrate field separately before the mask pattern is projected. For checking the movements of the mask and the substrate, the lithographic projection apparatus comprises very accurate measuring systems, preferably in the form of interferometer systems IF1 and IF2.

Figure 3:
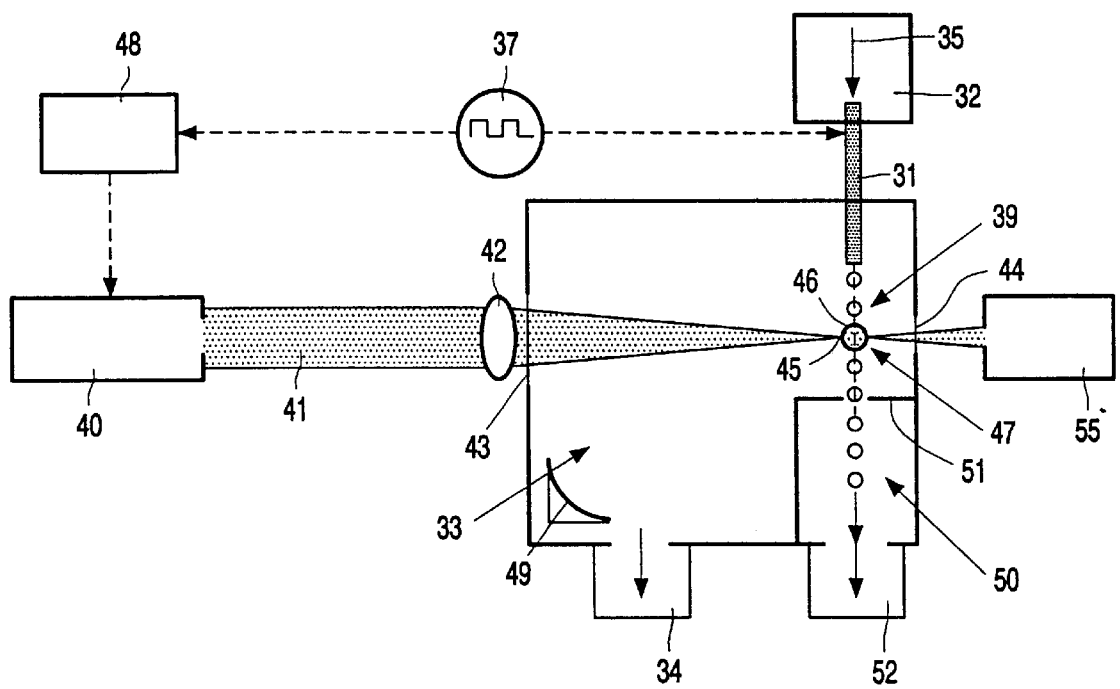
FIG. 3 is a cross-section of a known embodiment of an EUV radiation source unit.

The block denoted by reference numeral 2 in FIGS. 1 and 2 comprises an EUV radiation source unit in which EUV radiation is generated by irradiating liquid droplets, for example, water droplets with a high-intensity laser beam. FIG. 3 is a cross-section of an embodiment of such a radiation source unit in which water is used as a plasma-forming medium. This unit comprises a capillary tube 31, one end of which is connected to, for example, a water inlet, for example a water tank 32, and the other end projects into a source space 33. Water is transported at a high pressure through this tube to the source space, which is denoted by arrow 35. The source space 33 is connected to a pump 34, for example, a turbo pump having a power of, for example, 1000 dm$^3$/sec, with which the space 33 can be pumped to a vacuum of 10$^{-4}$ mbar. The capillary tube 31 is caused to vibrate, for example, by means of a piezoelectric driver 37. At a given vibration frequency, for example 0.3 MHz, the tube supplies an intermittent flow of individual water droplets 39. The droplet formation is based on the principle which is comparable with that used in various ink jet printers for forming ink droplets. The water droplets may not only be formed by means of piezoelectric pulses but also by thermal pulses or by ultrasonic means. At a water flow 35 of, for example, 5.4 ml/hour, the water droplets have a diameter of the order of 20 $\mu$m.

The radiation source unit further comprises a high-power laser 40, for example, an Nd-YAG laser which supplies laser pulses at a frequency of, for example, 10 Hz and at a pulse duration of, for example, 8 ns and with an energy content of 0.45 Joule. The optical frequency of the laser radiation may be doubled in known manner so that laser radiation with a wavelength of the order of 530 nm is obtained. An excimer laser, for example a Kr-F laser emitting at a wavelength of 248 nm, may be alternatively used as a laser source. The beam 41 emitted by the laser 40 enters, through a window 43, into the wall of the source space 33. This beam is focused by a lens system 42, illustrated by a single lens element, to a radiation spot 45 in a position 46 in a plane which is aligned with the centerline of the tube 31, along which line the water droplets move. An absorbing element 55 is arranged behind a second window 44 in the wall of the vacuum space 33, which absorbing element ensures that radiation of the laser beam exiting from the space 33 cannot enter the apparatus of which the radiation source unit forms part. The beam 42 is each time substantially focused on a water droplet which is instantaneously present at the position 46. The radiation spot 45 has a diameter of, for example, 30 $\mu$m so that a water droplet is completely irradiated. The driver 37 is synchronized with the laser driver via an electronic circuit 48 comprising a delay element, so that a laser pulse is generated at the instant when a water droplet arrives at the position 46. Due to the laser energy supplied to the water droplet, a plasma 47 in which oxygen ions are present is produced at the location of this droplet. As a result of the extremely high energy density, for example, of the order of 10$^{21}$ W/m$^3$ of the laser beam at the location of the droplet, this plasma reaches a temperature which corresponds to an energy of the order of 30 eV. At this high temperature, the dominant ionization state of oxygen O is VI. Then, EUV radiation is generated at wavelengths around 11.6 nm and 13 nm. For further details about the way and circumstances in which EUV radiation is formed, reference is made to the article "Laser produced oxygen plasmas" mentioned hereinbefore.

One or more mirrors 49 for collecting, concentrating and directing the generated EUV radiation may be arranged in the space 33. Alternatively, such mirrors may be arranged outside the space 33 so as yet to concentrate and direct the ELTV radiation exiting from this space. The number of mirrors required is dependent on the percentage of the EUV radiation which must be collected and used and is emitted by the plasma in all directions.

In this process, not all water droplets are converted into a plasma. Since the vapor pressure of water at room temperature is approximately 23 mbar, the water droplets which have not been converted must be removed from the source space 33, as well as the water vapor given off by the water droplets, so as to comply with the vacuum requirement emanating from the requirement that the absorption of EUV radiation must be negligible.

Furthermore, the wall of the space 33 must be provided with at least one aperture through which the generated EUV radiation can leave the space 33 and to enable it to enter the space accommodating the mirrors 10, 12 and 14 of the illumination system shown in FIG. 1. This aperture may be at the location of the window 43 in FIG. 3. In the presence of mirrors 49 in the space 33, the aperture is at a different location. It has been found that, due to the presence of one or more of such apertures, the problem not stated in the article: "Laser produced oxygen plasmas" may occur that water and water vapor exiting from this (these) aperture(s) may get on the mirrors of the illumination system and the projection system and may attack these mirrors, thus reducing their reflection. This is an important problem in lithographic projection apparatuses because a reduced reflection of the mirrors, by which less EUV radiation can reach the mask and notably the substrate, has a direct influence on an important performance parameter of such an apparatus, namely the rate at which substrates can be illuminated.

As indicated in FIG. 3, excess water droplets may be drained by introducing them into a further vacuum space 50 via a narrow aperture 51. In the space 50, a relatively low vacuum of, for example, 0.5 mbar is maintained by means of a further vacuum pump 52 having a power of, for example, 70 dm$^3$/sec. By means of this special embodiment of the principle of differential pumping, i.e. separate pumping of two communicating spaces to different degrees of vacuum, it should in principle be possible to maintain a relatively high vacuum, for example, of the order of $2 \times 10^4$ mbar, in the source space 33. However, it has been found that this is not the case in practice. The reason is that the part of the total quantity of water vapor formed in the source unit and ultimately reaching the space 50 from which it is removed is considerably smaller than was expected. Said part is, for example, only 65% instead of the expected 90%.

Figure 4:
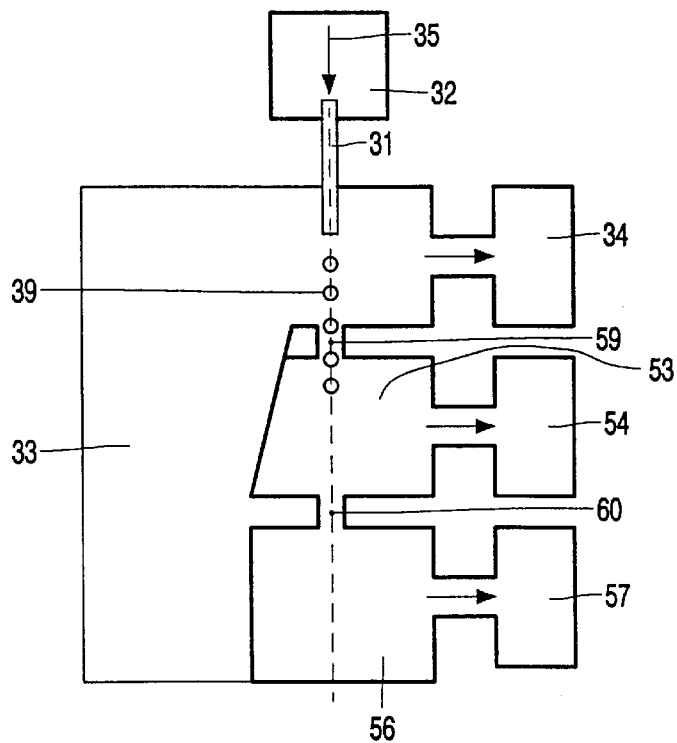
FIGS. 4, 5 and 6 show cross-sections of a first, a second and a third embodiment, respectively, of the radiation source unit according to the invention.

According to the invention, the removal of water and water vapor can be improved or even surprisingly improved considerably by making use of a plurality of vacuum spaces. FIG. 4 shows a cross-section of a possible embodiment of this radiation source unit. In this Figure, the elements corresponding to those of FIG. 3 are denoted by the same reference numerals. Furthermore, the components of the radiation source unit which are not important for the present invention are no longer shown in this Figure and in the following Figures. FIG. 4 and the following Figures show the radiation source unit in a cross-sectional plane which is 90° rotated with respect to the cross-sectional plane in FIG. 3 so that, inter alia, the apertures 43 and 44 for the laser beam are no longer visible in FIG. 4.

In the radiation source unit shown in FIG. 4, the source space 33, in which a high, total or partial, vacuum degree of, for example, 10$^{-4}$ mbar is maintained by means of the pump 34, is successively followed by a vacuum space 53 which communicates with a pump 54 and a second vacuum space 56 which communicates with a pump 57. The source space 33 is connected via a constriction or a narrow tube 59 to the space 53 and this space is connected to the space 56 via a constriction or narrow tube 60. The constrictions or tubes 59 and 60 are aligned with the centerline of the inlet tube 31 and the direction of movement of the water droplets 39 so that the water droplets which have not been converted into plasma are collected in the space 53 and the space 56. For the choice of the apertures of the tubes 50 and 60, an optimum must be found between the vacuum-technical aspect, in accordance with which the apertures must be as small as possible, and the alignment aspect, in accordance with which the apertures must not be too small. The vacuum pump 54 has a lower capacity than that of the pump 34 and the vacuum pump 57 has a lower capacity than that of the pump 54. By correct choice of the constrictions 59 and 60, it can be ensured that a low vacuum degree of, for example, 0.5 mbar is maintained in the space 56, and a vacuum degree between that of the source space 33 and that of the space 56, for example, $10^{-2}$ mbar is maintained in the space 53. The vacuum pumps are chosen to be such that the water injected into the system is pumped off as water vapor as much as possible so that the radiation source unit can operate as much as possible continuously and at constant pressure levels. Moreover, it is then maximally prevented that water vapor or water penetrates through the apertures 43 and 44 into other spaces of the lithographic projection apparatus and may damage the optical elements present in this apparatus.

Figure 5:
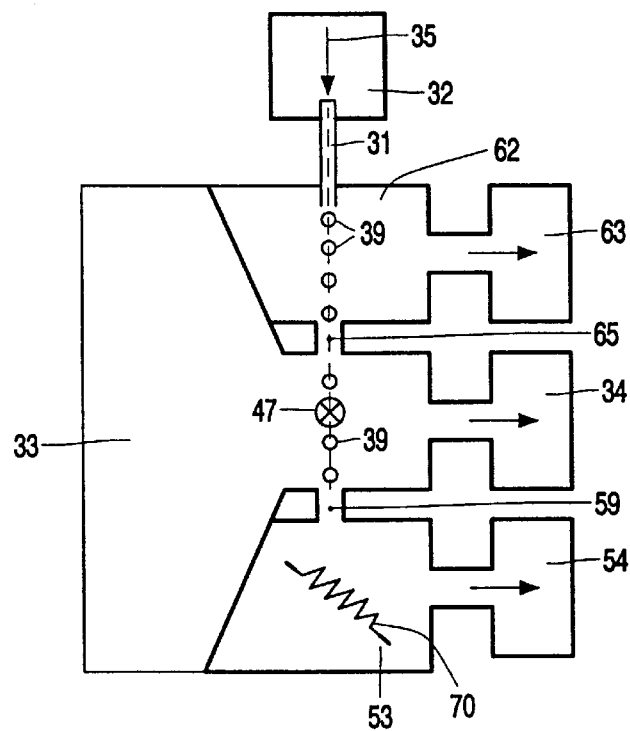

FIG. 5 shows a highly preferred embodiment of the radiation source unit with which the envisaged object can be achieved much better than with the unit shown in FIG. 4. In the unit shown in FIG. 5, an extra vacuum space 62 is present between the water tank 32 and the source space 33. The space 62 is connected via a constriction or narrow tube 65 to the source space and is exhausted by a vacuum pump 63. Via the space 62, a considerable part, for example 25%, of the total supply of water is pumped off as water vapor so that the space 53 is now capable of fulfilling its, now lighter, task. By correct choice of the pump capacity and the constriction 65, it is ensured that the vacuum degree of the space 62 is lower than that of the source space 33. It is thereby achieved that substantially no water vapor is injected along with the injection of the water droplets, which contributes to maintaining the source space itself free from water vapor.

As is shown diagrammatically in FIG. 5, a heating element 70 may be arranged in the vacuum space 53. It is thereby prevented that a layer of ice is formed in this space, which ice layer may expand upwards and be a risk for the continuous operation of the radiation source unit.

Since the narrow constrictions or tubes 65 and 59 should be as narrow as possible from a vacuum-technical point of view, there is a risk that a water droplet touches the inner wall of such a tube so that ice is formed on this wall. Consequently, the relevant tube may be clogged with ice in the course of time so that the radiation source no longer functions. To prevent this, the tubes or constrictions may be heated. This is an important practical aspect of the present invention.

Figure 6:
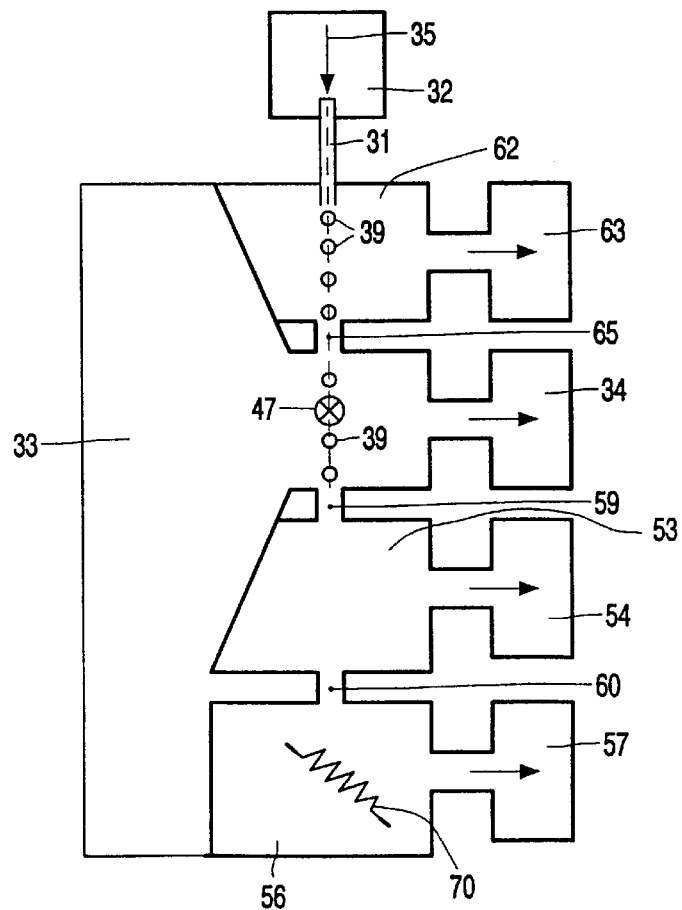

FIG. 6 shows a further improvement of the radiation source unit of FIG. 5. The first vacuum space 53 is now followed by a third vacuum space 56 which also occurs in the unit of FIG. 4. With the aid of this third vacuum space, water which is still left in the source unit of FIG. 5 can be pumped off. The heating element is now arranged in the third vacuum space 56.

The fact that water droplets are used as a medium for forming the plasma in the embodiments described hereinbefore does not mean that the invention is limited thereto. As has been described in the above-mentioned article "Debris-free soft x-ray generation using a liquid droplet laser-plasma target, ethanol droplets may be alternatively used as a medium for forming a plasma emitting EUV radiation. Similar problems as with water droplets occur, which problems can be solved by using the invention.

Water and ethanol are only two examples of possible liquid media which, if irradiated with a high-power pulsed laser, form an EUV radiation emitting plasma and can be used in a laser-generated plasma EUV radiation source. Generally, the invention can be used in all EUV radiation sources in which a liquid medium is converted by a high-power pulsed laser into an EUV radiation-emitting plasma and in which the problems occur that the medium raises the (vapor) pressure in the source space and the plasma formed repels contaminating particles which may penetrate the high-vacuum space and reduce the reflection of the mirrors which are present in this space.

Gaseous media instead of liquid media may be alternatively used in an EW radiation source. For several years, theories have been developed about and experiments have been carried out on the interaction between high laser energy and xenon clusters for creating a plasma which emits EUV radiation to a sufficient extent, as was recently reported from different research centers at the OSA Conference on Applications of High Field and Short Wavelength Sources VIII (1999). The xenon clusters exiting from the inlet tube expand, reduce their temperature and are converted on their way through the radiation source unit. However, xenon gas absorbs EUV radiation to a great extent so that, without further measures, the EUV radiation output of a xenon plasma source would be too small to operate projection lithography with such a source. By making use of the vacuum spaces in accordance with the present invention, the xenon gas can be removed from the radiation source unit. The embodiments of FIGS. 4, 5 and 6 may be used for this purpose, with xenon clusters being supplied through a tube similar to the tube 31 in these Figures, which tube is then not caused to vibrate.

EUV radiation sources may not only be used in lithographic projection apparatuses but also in EUV microscopes having a very high resolving power. The radiation path of the EUV radiation in such a microscope must be in a high vacuum. To achieve that the EUV radiation source unit in such a microscope can operate continuously at constant pressure levels, and to prevent the desired vacuum in the spaces of the microscope accommodating the optical components from being attacked from the radiation source, the invention and its various described embodiments may be used to great advantage.

What is claimed is:

1. A method of generating EUV radiation, in which a mobile medium is injected into a vacuum source space and each time a subsequent part of said medium in the source space is irradiated with a pulsed and focused energy-rich laser beam, and in which said medium part is converted into a plasma emitting EUV radiation, whereafter the medium is passed through a first further vacuum space in series with the source space, said further vacuum space being maintained at a lower vacuum degree than the source space, characterized in that the medium is passed through at least a second further vacuum space in series with the source space, which second vacuum space is maintained at a lower vacuum degree than the source space.

2. A method as claimed in claim 1, characterized in that the mobile medium is injected into the source space via the second further vacuum space.

3. A method as claimed in claim 2, characterized in that, after passing through the source space and the first further vacuum space, the medium is passed through a third further vacuum space in which a vacuum degree is maintained which is lower than that of the first further vacuum space.

4. A method as claimed in claim 1, characterized in that an intermittent flow of individual liquid droplets is injected as a mobile medium into the source space, which liquid droplets form an EUV-emitting plasma upon irradiation with a laser beam.

5. A method as claimed in claim 4, characterized in that water droplets are used as liquid droplets.

6. A method as claimed in claim 1, characterized in that a clustered gas is injected as a mobile medium into the source space, in which the clusters form an EUV-emitting plasma upon irradiation with a laser beam.

7. A method as claimed in claim 6, characterized in that the gas is xenon.

8. A method of manufacturing a device, in which the dimensions of the smallest details are smaller than 0.25 μm, on a substrate, in which method different layers of the device are formed in successive steps by imaging by means of EUV radiation, for each layer, first a specific mask pattern on the substrate coated with a radiation-sensitive layer and by subsequently removing material from, or adding material to, areas marked by the mask image, characterized in that the EUV radiation is generated by means of the method as claimed in claim 1.

9. An EUV radiation source unit comprising:

a vacuum source space;

an inlet tube located on a first side of the source space for injecting a mobile medium into the source space;

a pulsed high-power laser;

an optical system for focusing the laser beam supplied by the laser on a fixed position within the source space where the mobile medium passes, apertures in facing wall parts of the source space for causing the laser beam to enter into and exit from the source space, and a first further vacuum space which, viewed in the direction of movement of the medium, is located behind the source space with which it communicates, which vacuum space is connected to its own vacuum pump, characterized by at least a second further vacuum space in series with the source space, which second vacuum space is connected to its own vacuum pump maintaining this space at a vacuum degree which is lower than that of the source space.

10. An EUV radiation source unit as claimed in claim 9, characterized in that, viewed in the direction of movement of the medium, the second further vacuum space is arranged in front of the source space.

11. An EUV radiation source unit as claimed in claim 9, characterized in that, viewed in the direction of movement of the medium, a third vacuum space is present behind the first further vacuum space, which third vacuum space communicates with the first further vacuum space and is connected to its own vacuum pump maintaining the third vacuum space at a vacuum degree which is lower than that of the first further vacuum space.

12. An EUV radiation source unit as claimed in claim 9, characterized in that, viewed in the direction of movement of the medium, a heating element is arranged in the last vacuum space.

13. An EUV radiation source unit as claimed in claim 9, in which connections between source and vacuum spaces and mutually between vacuum spaces consist of narrow constrictions or tubes, characterized in that means are present for heating at least the inner walls of said tubes or constrictions.

14. An EUV radiation source unit as claimed in claim 9, characterized in that the inlet tube is connected to a liquid supply.

15. An EUV radiation source unit as claimed in claim 14, characterized in that the liquid supply is a water supply.

16. An EUV radiation source unit as claimed in claim 9, characterized in that the inlet tube is connected to a gas supply.

17. An EUV radiation source unit as claimed in claim 16, characterized in that the gas supply is a xenon supply.

18. A lithographic projection apparatus for imaging a mask pattern on a substrate provided with a radiation-sensitive layer, which apparatus comprises an illumination system for illuminating the mask pattern and a projection system for imaging the illuminated mask pattern on the substrate, the illumination system comprising an EUV radiation source, while the optical components of the illumination system and those of the projection system are present in a vacuum space, characterized in that the EUV radiation source is a radiation source unit as claimed in claim 9.

* * * * *